(12) United States Patent
Finnerty et al.

(10) Patent No.: US 7,539,026 B2
(45) Date of Patent: May 26, 2009

(54) SUB-MEZZANINE STRUCTURE FOR PRINTED CIRCUIT CARD ASSEMBLIES

(75) Inventors: Michael James Finnerty, Delran, NJ (US); Stefan Gerhard Levie, Gloucester County, NJ (US); Joseph Peter Norris, III, Hainesport, NJ (US)

(73) Assignee: Technobox, Inc., Lumberton, NJ (US)

( * ) Notice: Subject to any disclaimer, the term of this patent is extended or adjusted under 35 U.S.C. 154(b) by 0 days.

(21) Appl. No.: 11/837,666

(22) Filed: Aug. 13, 2007

(65) Prior Publication Data

US 2008/0043448 A1 Feb. 21, 2008

Related U.S. Application Data

(60) Provisional application No. 60/822,571, filed on Aug. 16, 2006.

(51) Int. Cl.
*H05K 1/11* (2006.01)
*H05K 1/14* (2006.01)

(52) U.S. Cl. .............. 361/803; 361/810; 361/807; 361/785

(58) Field of Classification Search ........ 361/810, 361/807, 792, 799, 803–804, 784–785
See application file for complete search history.

(56) References Cited

U.S. PATENT DOCUMENTS

| | | | |
|---|---|---|---|
| 3,686,533 A * | 8/1972 | Garnier et al. ............ 361/719 |
| 5,257,379 A | 10/1993 | Cwiakala et al. |
| 5,793,998 A | 8/1998 | Copeland et al. |
| 5,903,439 A * | 5/1999 | Tamarkin ............. 361/742 |
| 6,542,952 B1 | 4/2003 | Western |
| 6,587,351 B2 | 7/2003 | Hollinsworth et al. |
| 6,599,138 B1 * | 7/2003 | Yeo et al. ............... 439/108 |
| 6,805,560 B1 | 10/2004 | Budny et al. |
| 6,917,523 B2 | 7/2005 | Summers et al. |
| 6,951,466 B2 * | 10/2005 | Sandoval et al. ........... 439/74 |
| 6,983,385 B2 | 3/2006 | German et al. |
| 7,042,734 B2 | 5/2006 | Hensley et al. |
| 7,082,487 B2 | 7/2006 | Darwish et al. |
| 7,212,961 B2 * | 5/2007 | Settles ................. 703/23 |

* cited by examiner

*Primary Examiner*—Hung S Bui
(74) *Attorney, Agent, or Firm*—Gerry J. Elman; Elman Technology Law, P.C.

(57) ABSTRACT

A method of assembling and configuring multiple mezzanine cards on a carrier card is disclosed. The method includes the establishing an I/O profile that represents the I/O configuration of a mezzanine card. The I/O of the mezzanine card is not enabled unless the I/O profile matches a known value stored on the carrier card. In this way, the electronic circuitry is protected if an incorrect mezzanine card is connected to the carrier card.

13 Claims, 14 Drawing Sheets

SUB-MEZZANINE STRUCTURE FOR PRINTED CIRCUIT CARD ASSEMBLIES

CROSS REFERENCE TO RELATED APPLICATIONS

This application claims benefit to U.S. Provisional Application Ser. No. 60/822,571 filed on Aug. 16, 2006, the disclosure of which is incorporated herein by reference in its entirety.

FIELD OF THE INVENTION

The present invention relates to a printed circuit (PC) card assembly. More particularly, the present invention relates to a mezzanine circuit board that is mounted to a carrier circuit board.

BACKGROUND

Requirements for input/output (I/O) pin connections between circuit cards and motherboards often exceed the available circuit card edge length and exceed the maximum available connector pin density. One solution to this problem is the use of a supplemental card portion called a "mezzanine" card (sometimes referred to as a "daughter" card) that is mounted to the main circuit card (referred to generically as the carrier card) in order to provide one or more additional connectors and additional I/O pins. Such mezzanine cards are useful to provide additional functionality to a main circuit card, typically in the form of increased I/O capability. This increased I/O capability serves a variety of applications such as data acquisition and communication just to name a few. Mezzanine cards provide a convenience for configuring a carrier card. For a given carrier card with a suitable Field Programmable Gate Array (FPGA), there can be numerous configurations of attachable mezzanine cards that can satisfy a wide application scope. Modules can be digital, analog, communication, etc. and there can be a "mix" of such modules on a single carrier card. As applications continue to demand increased data processing and communications, while retaining compact physical size, mezzanine cards are commonly used to meet these demands.

However, the use of mezzanine cards creates new design issues because the connectors on the main circuit card and the mezzanine card must be spaced at a carefully controlled distance so that the circuit card and mezzanine card connectors can be mated properly with the mating connectors that are positioned on the main circuit card. The spacing between the connectors on the main circuit card and the mezzanine card is relatively small. Since electronic devices on the mezzanine card give off heat during operation, the confined area between the main circuit card and the mezzanine card also makes heat dissipation an issue. Furthermore, since the applications for which the mezzanine cards are used often are harsh environments with considerable mechanical vibration, there is also an issue regarding the robustness of the mechanical mounting of the mezzanine card to the main circuit card. Therefore, it is desirable to have an improved mezzanine structure for PC assemblies.

SUMMARY OF THE INVENTION

A novel arrangement and assembly method are disclosed in order to more efficiently arrange mezzanine cards on a carrier card. The carrier card may conform to any one of a number of standards, including, but not limited to, PCI Mezzanine Card (PMC), AMC, CMC, XMC, CompactPCI, PC104, PCI, PCI Express, and VME. One preferred embodiment of the mezzanine card of the present invention has a substantially square form factor, of about 1.25 inches on each side. This form factor provides the advantages of making efficient use of board space, and allowing up to four such mezzanine cards to be placed on a PMC, and still comply with the dimensional requirements of both the IEEE 1386 and VITA 20 standards. The mezzanine card of the present invention is a "single connector" mezzanine card. A single connector is used on the mezzanine card to simplify alignment issues, thereby providing more efficient assembly. The mezzanine card is mounted on standoffs to facilitate attachment of semiconductor devices (chips) on both sides of the mezzanine card. In a preferred embodiment, the single connector is a high density 2 millimeter stacking connector. The standoffs are preferably secured in place on the carrier card with solder, and then fasteners, such as screws having an adhesive substance applied to them are used to fasten the mezzanine board to the carrier card. As an alternative, or in addition to the adhesive, lock washers may be used, so long as the desired dimensional requirements are not exceeded.

Due to dimensional requirements of IEEE 1386, the standoffs are fairly low, leaving little space between the mezzanine card and the carrier card assembly. Therefore, heat dissipation is an area of concern when using mezzanine cards. The present invention optionally provides additional heat dissipation via a conformal heat conductive material that is placed between the carrier card assembly and the mezzanine card. The use of the conformal heat conductive material depends on the application. In a low-power application, air cooling may be sufficient. However, high-power applications may require the additional heat dissipation achieved with the conformal heat conductive material.

In an alternate embodiment, the carrier can actually be another mezzanine card, in which case, the mezzanine card of the present invention acts as a so called "sub-mezzanine" card. However, it is possible to use the mezzanine card of the present invention directly with a main circuit board configured with the proper connections without departing from the scope of the present invention.

The present invention provides the advantages of increasing the I/O flexibility of a carrier card such as a PMC, provides acceptable heat dissipation within a small physical form factor, and provides a secure mechanical mount of the mezzanine card to the carrier card. Another key advantage of the present invention is the ability to support multiple mezzanine cards on a single PMC. This provides the flexibility of configuring multiple functions on a single carrier card.

The present invention also provides the advantage of identifying the type of mezzanine card present, comprising the steps of reading an identification string with a processor or FPGA on the carrier card. The identification string includes an I/O profile as part of its data. This I/O profile contains information about the status of each I/O pin on the mezzanine card, including whether a particular I/O pin is to be used as an input, output, or bi-directional. This I/O profile is compared with a constant value (reference data) stored in the FPGA or memory on the carrier card. Only if the I/O profile matches the constant value, will the I/O pins be enabled (transitioned from tri-stated to active) on the mezzanine card. If the I/O profile does not match, the I/O pins on the mezzanine card are tri-stated, thereby protecting the mezzanine card circuitry.

These advantages, and others, will be apparent from the detailed description and drawings that follow.

ASPECTS OF THE INVENTION

1. This aspect of the invention is a circuit card assembly comprising:

a carrier card (300);

at least one single connector mezzanine card (100);

wherein the single connector mezzanine card makes electrical contact with the carrier card via a connector (108) on the mezzanine card that is in electrical contact with a corresponding connector (304) on the carrier card, the carrier card having a plurality of mounting holes (312), and a plurality of standoffs (308), each mounting hole (312) having a corresponding standoff (308) aligned with it, the single connector mezzanine card (100) having a plurality of mounting holes (104, 106) aligned with the standoffs (308), and having screws (306) having a threaded shaft (602) wherein the lower portion of the threaded shaft (602) has adhesive (604) applied to it, thereby securely fastening the mezzanine card (100) to the carrier card (300).

2. This aspect is the circuit card assembly of aspect 1, further comprising a layer of conformal heat conductive material (702) is applied on the carrier card 300, underneath mezzanine card 100.

3. This aspect is a method for assembling a single connector mezzanine card to a carrier card, comprising the steps of;

Aligning standoffs (308) with mounting holes (312) of a carrier card (300), and soldering the standoffs to the carrier card, placing a single connector mezzanine card (100) onto the carrier card such that mounting holes (104,106) of the mezzanine card are aligned with the standoffs, and applying adhesive (604) to the lower portion of the threaded shaft (602) of screws (306), and fastening the mezzanine card to the carrier card with the screws.

4. This aspect is a method for the carrier card to identify the type of mezzanine card present, comprising the steps of reading an identification string transmitted by the mezzanine card, and receiving the identification string with a processor or FPGA on the carrier card, the processor or FPGA using the identification string as a means of establishing signal directionality between the FPGA on the carrier card and the mezzanine card I/O.

DETAILED DESCRIPTION OF PREFERRED EMBODIMENTS

Figure 1:
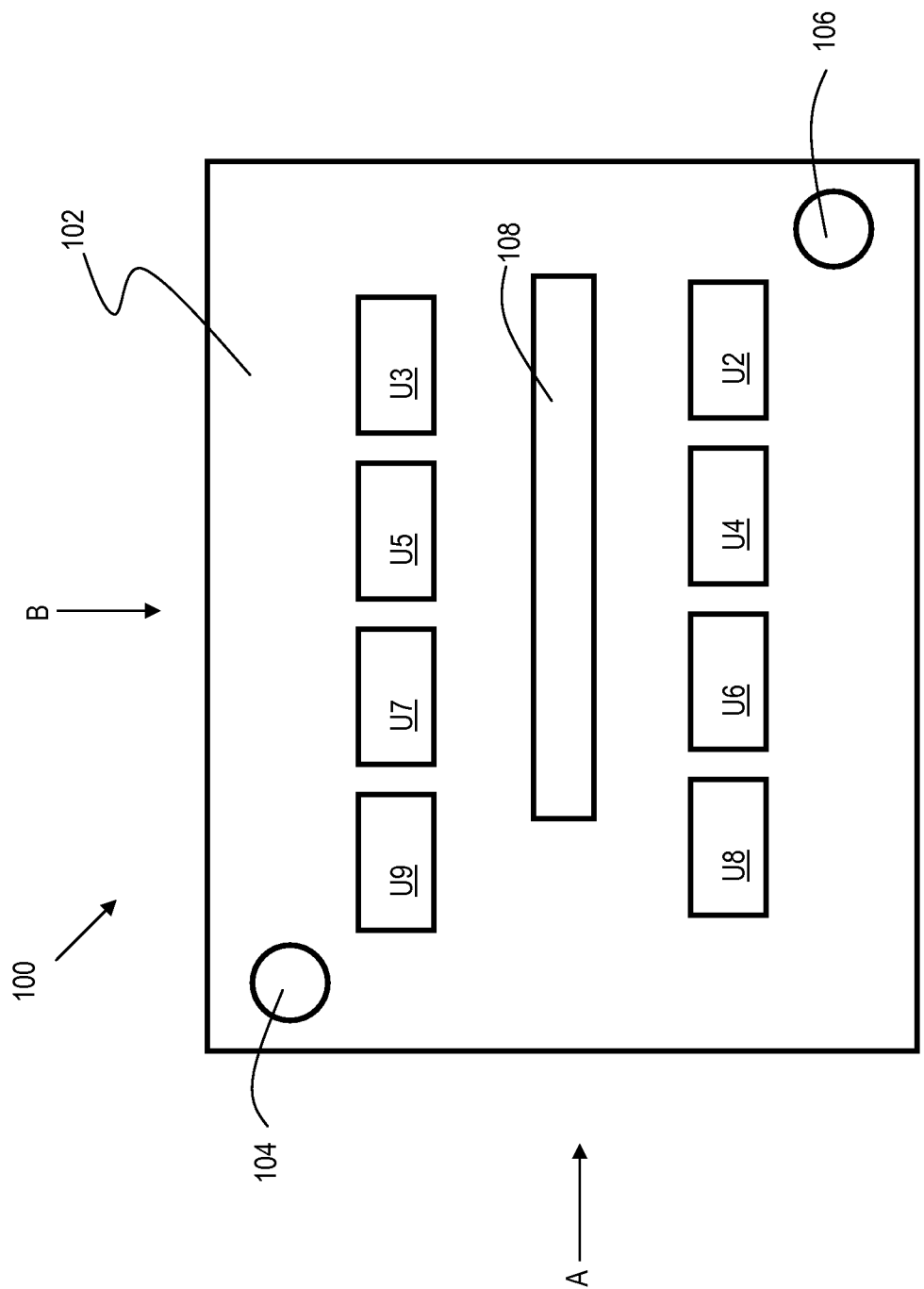
FIG. 1 shows a plan view of the connector side of a preferred embodiment of the mezzanine card of the present invention.

FIG. 1 shows a plan view of the connector side of a preferred embodiment of the single connector mezzanine card 100 of the present invention. Mezzanine card 100 comprises printed circuit card 102, which has mezzanine connector 108 attached thereto. In a preferred embodiment, connector 108 is a high density 2 millimeter stacking 80-contact connector.

Using a single connector 108 provides an advantage over previous designs that have employed multiple connectors. When multiple connectors are used, there is increased chance for tolerance build-up that causes alignment issues, and prevents mounting of the mezzanine card. The present invention overcomes these problems by using a single high density connector. In one embodiment, the single high density connector is not keyed. Using a non-keyed connector reduces the risk of damage due to someone inadvertently trying to force the two parts of the keyed connector together in the wrong position. Therefore, in order to reduce the risk of incorrect attachment, the single high density connector 108 is purposely placed off-center within the mezzanine card 100. By having an offset mezzanine connector, it becomes noticeable when the mezzanine card 100 is inserted incorrectly, since the mezzanine mounting holes 104 and 106 of the mezzanine card 100 will not line up with mounting holes 312 of the carrier card 300.

Mezzanine card 100 has a plurality of mounting holes. In a preferred embodiment, two mezzanine mounting holes are positioned at opposite corners, indicated as 104 and 106. Mezzanine card 100 accommodates multiple integrated circuit devices (hereinafter referred to as "chips"). In the embodiment shown, eight chips, referenced as U2 through U9 are shown.

Figure 2:
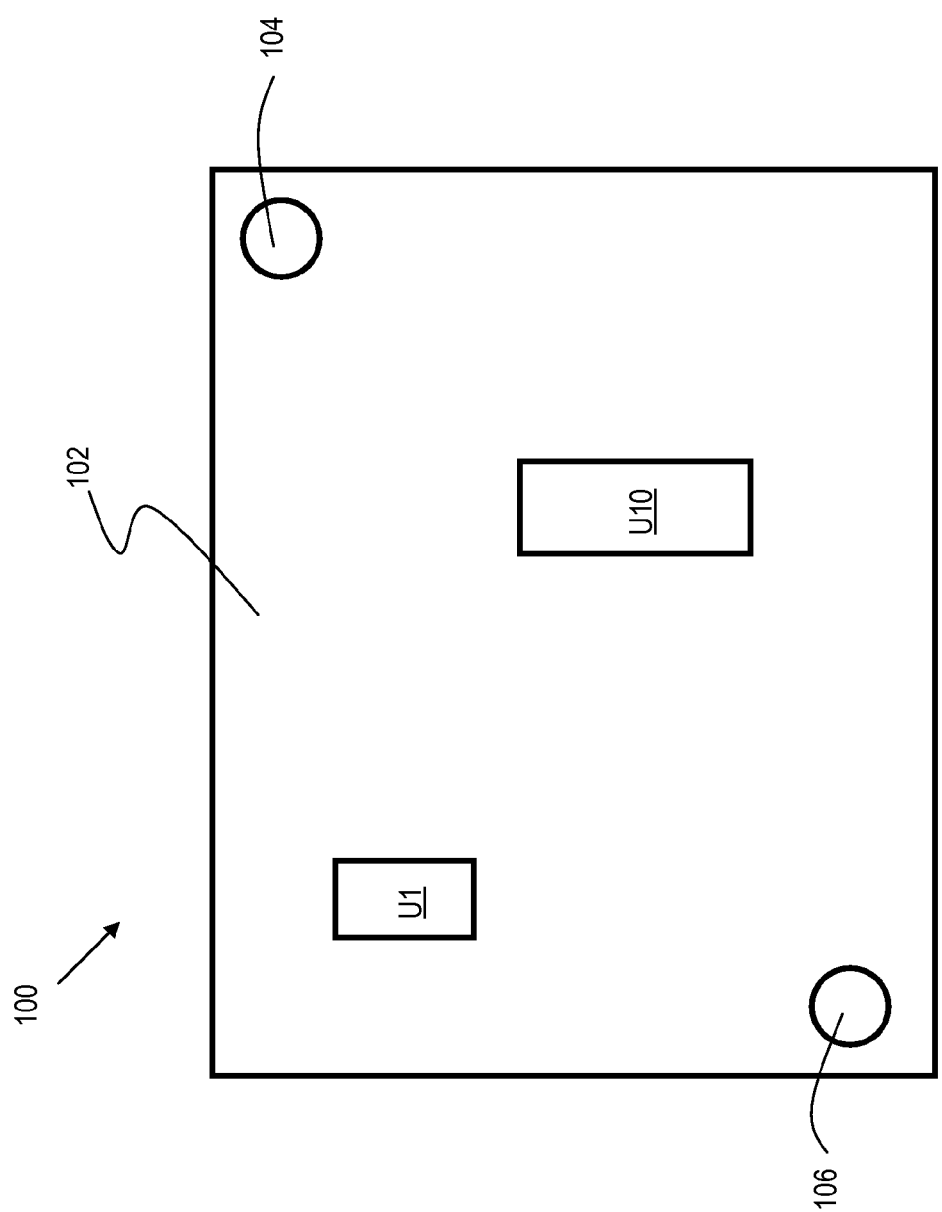
FIG. 2 shows a plan view of the non-connector side of the embodiment shown in FIG. 1.

FIG. 2 shows a plan view of the non-connector side of the mezzanine card 100 shown in FIG. 1. Additional devices may be placed on this side. In the embodiment shown, two devices, indicated as U1 and U10 are shown. In a preferred embodiment, one of the devices (chips) present on the mezzanine card 100 is a microcontroller. The microcontroller is used for generating and transmitting an identification string. This identification string can be used by the carrier card to identify an attached mezzanine card. More particularly, the identification string contains an I/O profile for the mezzanine card 100. This I/O profile contains data representative of the I/O status (e.g. input, output, or bi-directional) for each I/O signal on the mezzanine card 100.

Figure 3:
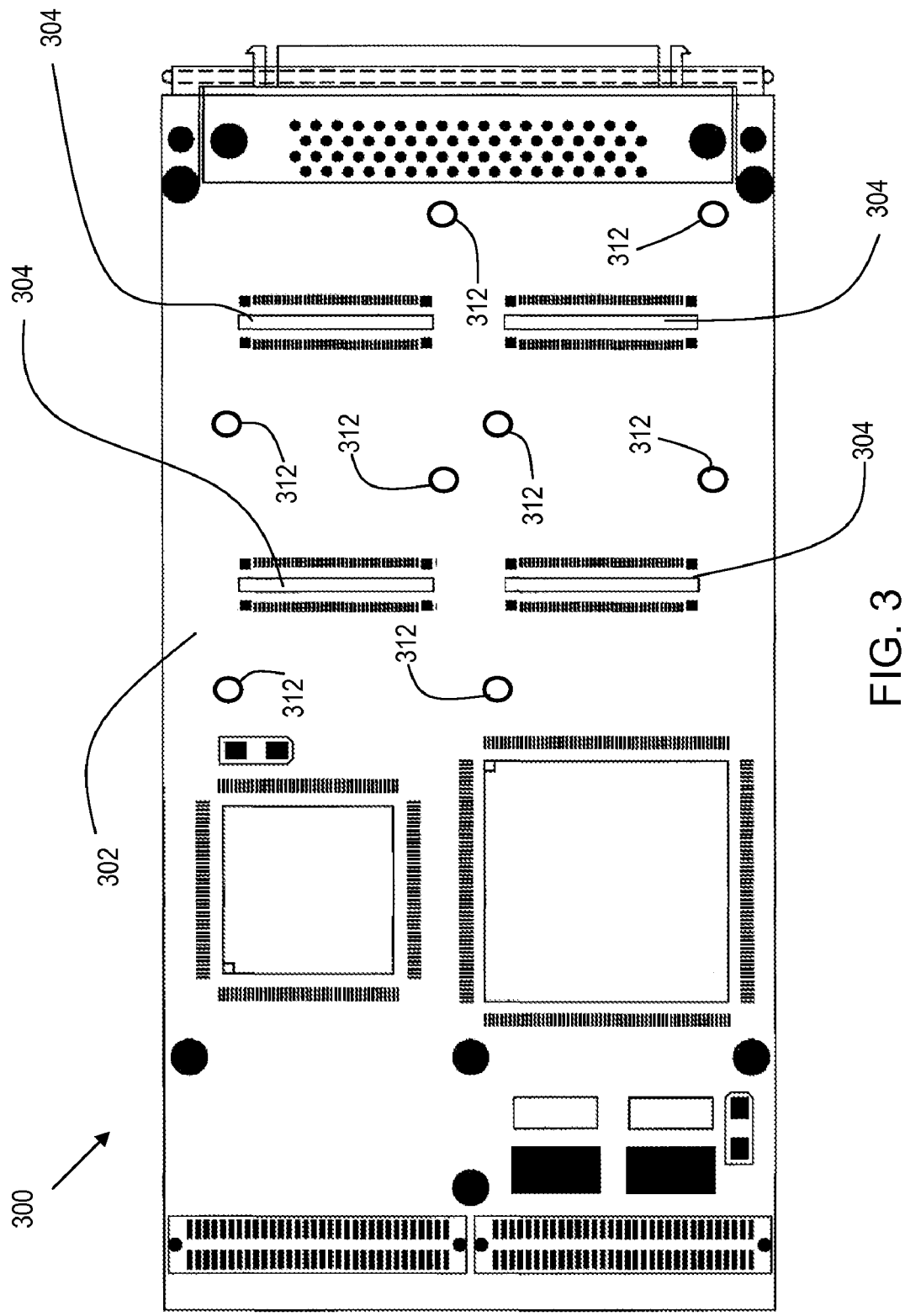
FIG. 3 shows a plan view of an exemplary carrier card of the present invention.
Figure 4A:
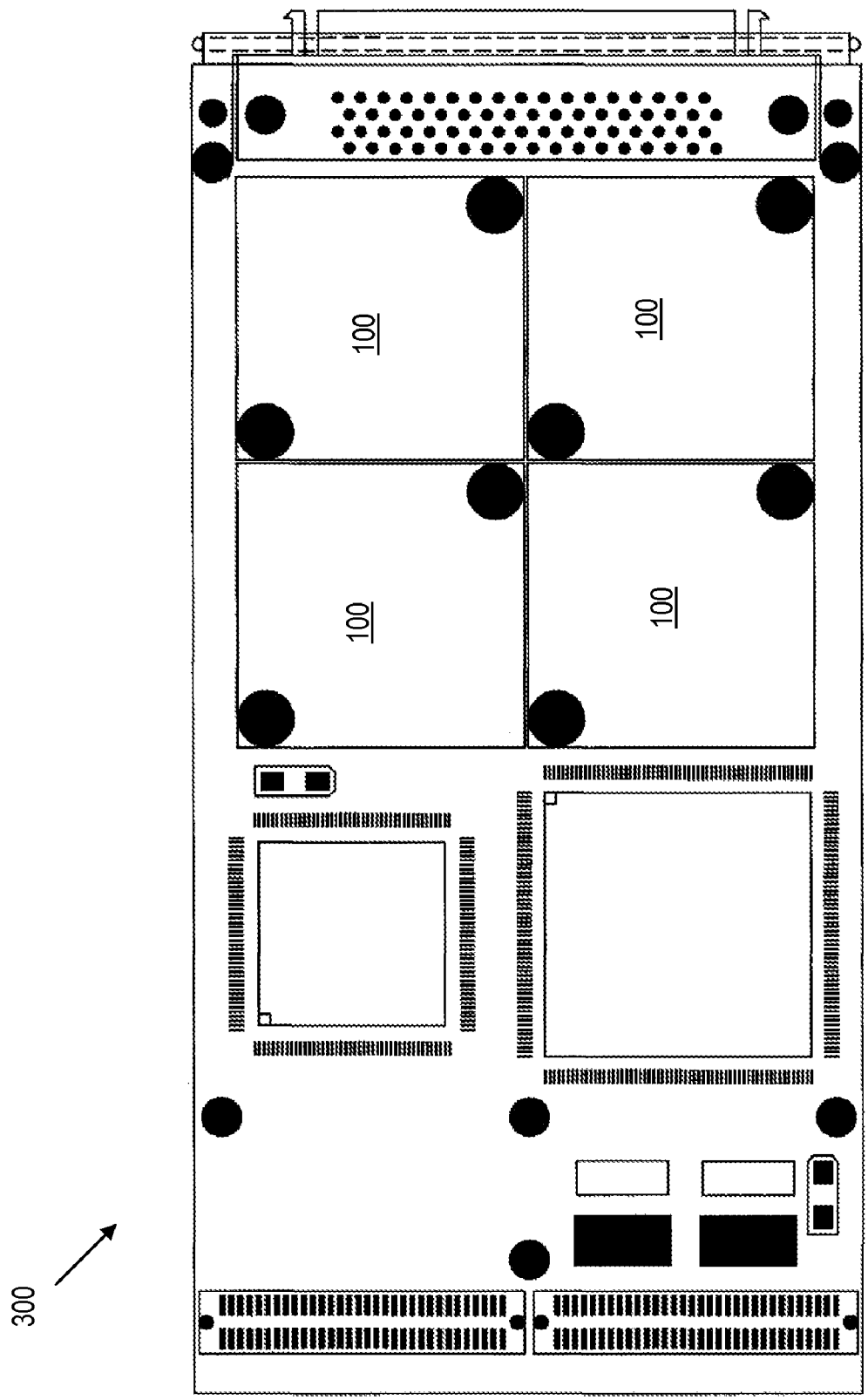
FIGS. 4A and 4B show plan views of exemplary carrier cards utilizing multiple mezzanine cards of the present invention.

FIG. 3 and FIG. 4A show plan views of an exemplary carrier card 300 of the present invention. The carrier card 300 comprises a printed circuit card 302, with a plurality of devices mounted thereon. The embodiment shown in FIG. 3 is a PCI Mezzanine Card (PMC). PMC cards are generally known in the art. However, the PMC card of the present invention has a unique arrangement of four carrier card connectors, each indicated as 304. Each carrier card connector 304 mates with mezzanine connector 108 on a mezzanine card 100, forming a connector pair. The arrangement of connectors 304 allow up to four mezzanine cards 100 to be mounted on PMC carrier card 300, as is shown in FIG. 4 Note that in this case, the carrier card 300 is itself a mezzanine card, making mezzanine card 100 a sub-mezzanine card. However, for consistent terminology, carrier card refers to the circuit card on which mezzanine card 100 is mounted. The term "mezzanine" card is used to refer to the smaller "daughter" card, regardless of whether the carrier card is another mezzanine card, or a main circuit card.

Figure 4B:
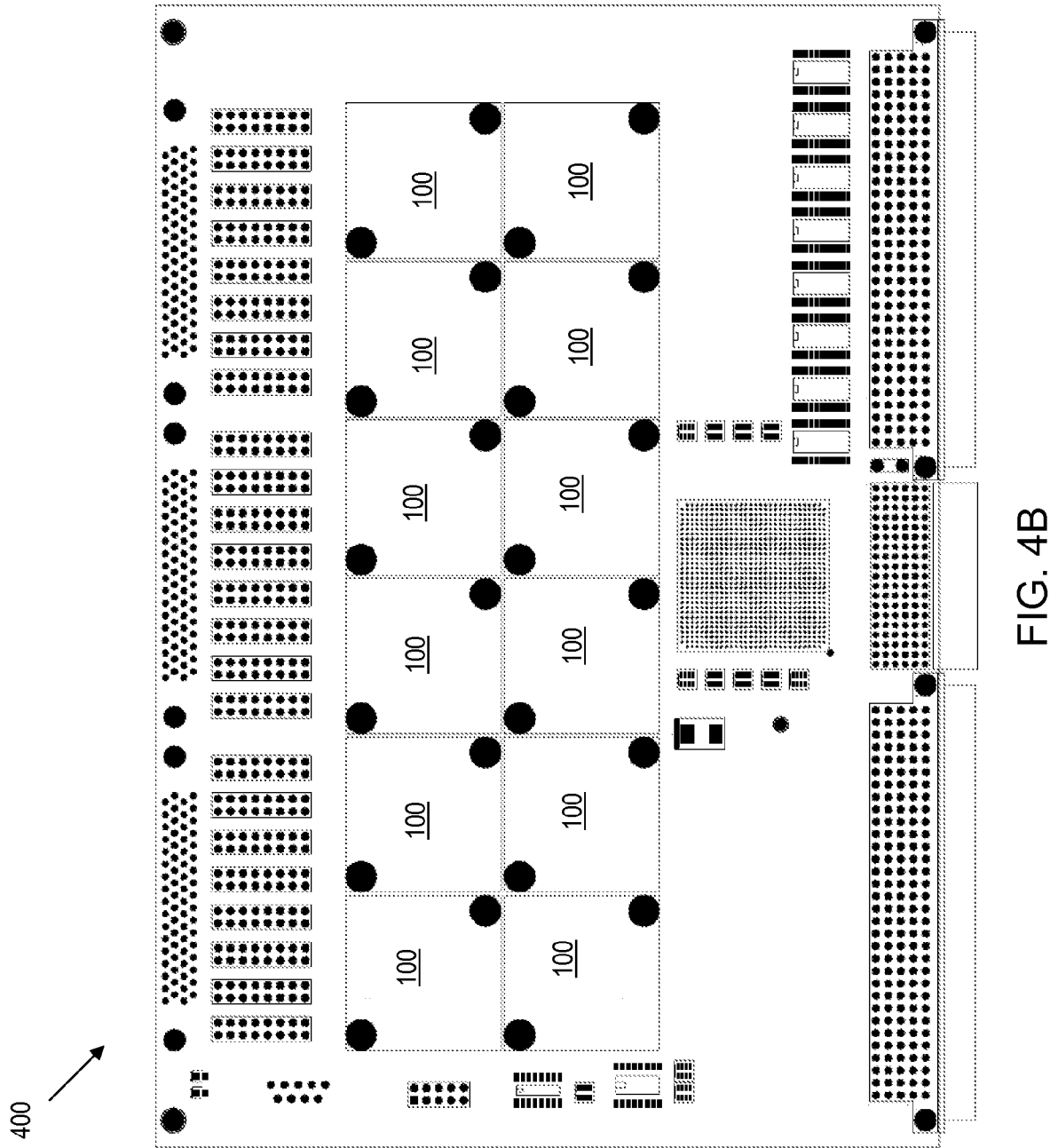

FIG. 4B shows an alternative embodiment of the carrier card 400 of the present invention. In this embodiment, the carrier card 400 adheres to the VME standard, and can support up to twelve mezzanine cards 100.

Figure 5A:
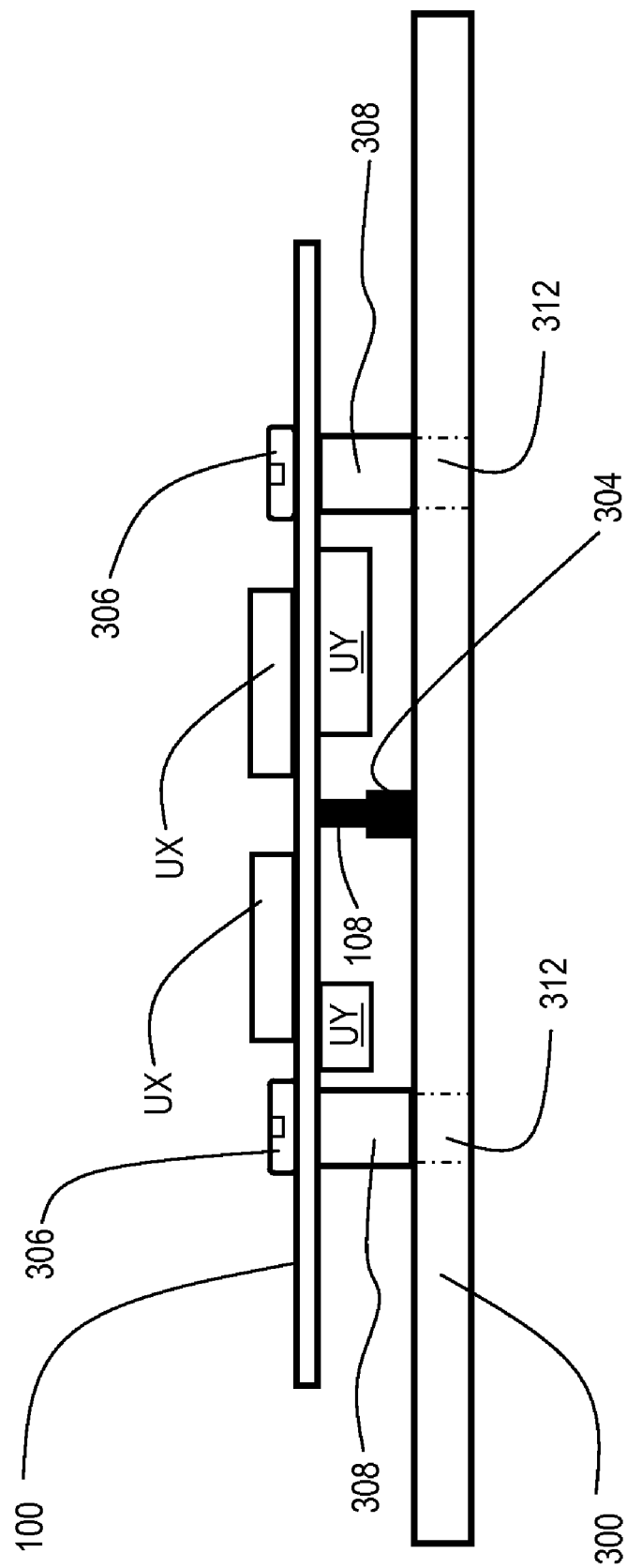
FIGS. 5A and 5B show side views of a mezzanine card mounted to a carrier card.

FIG. 5A shows a side view of a mezzanine card 100 mounted to a carrier card 300 as viewed from position A of FIG. 1. The mezzanine card 100 has a plurality of chips installed on it, referred to generally as UX for the chips on the non-connector side of the mezzanine card 100, and UY for the chips on the connector side of the mezzanine card 100. For clarity of the drawing, not all chips are marked with a reference. Carrier card 300 has a plurality of carrier card mounting holes 312 aligned with holes 104 and 106 of mezzanine card 100. In a preferred embodiment, standoffs 308 are placed on carrier card 300 during the board population process, and then soldered on to permanently mount them. In a preferred embodiment, standoff 308 is a 2 millimeter standoff, such as that manufactured by PennEngineering of Danboro, Pa., USA. Standoffs 308 are positioned on carrier card 300 aligned with mounting holes 312. Mezzanine card 100 is then placed on to carrier card 300 such that the connector side of mezzanine card 100 (shown in FIG. 1) faces the carrier card 300. Mezzanine card connector 108 makes electrical contact with carrier card connector 304. A plurality of screws, indicated as 306, mechanically fasten mezzanine card 100 to carrier card 300.

The type and number of chips shown are dependent on the specific application. It is preferable that low profile chips, such as Small Outline Integrated Circuits (SOICs) are used, to remain within the acceptable physical size limits. For example, in the case of the IEEE 1386 specification, the cumulative height of the mezzanine board (including mounted components) must be less than 4.7 millimeters from the surface of the carrier card.

Figure 5B:
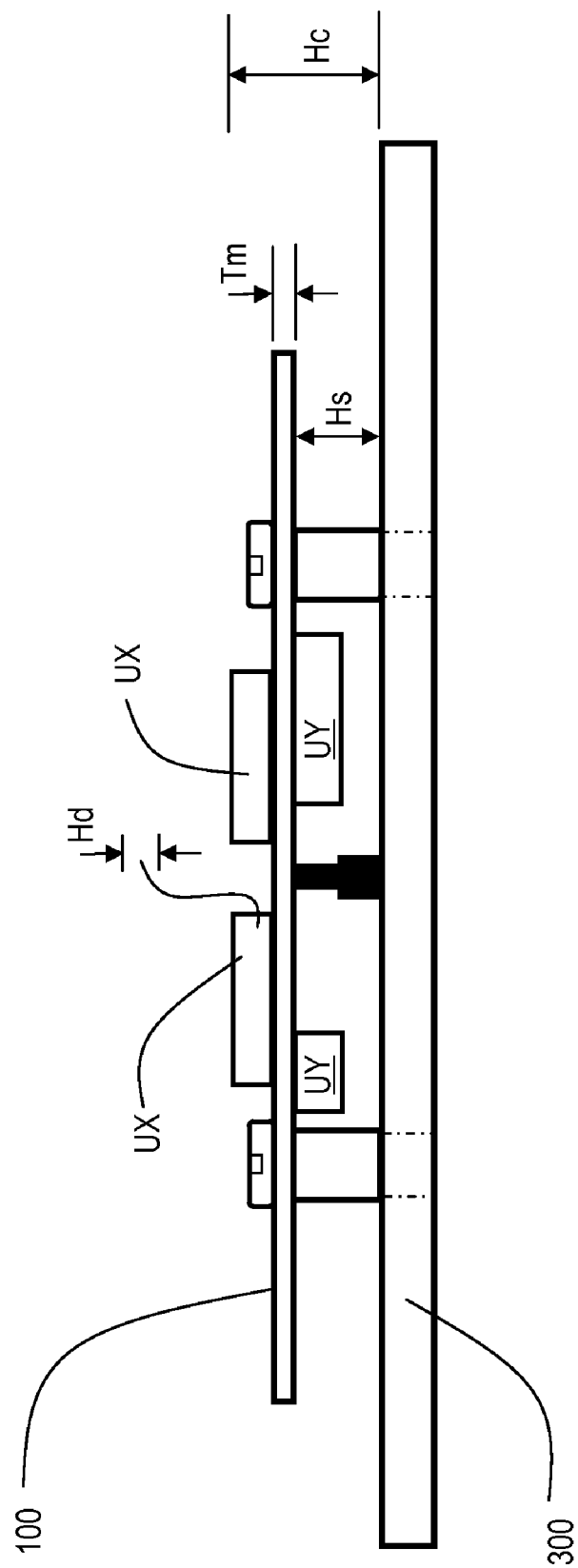

FIG. 5B shows the key dimensions that are considered to be within limits of the cumulative height Hc. To remain within the cumulative height limit, the mezzanine card thickness Tm of the mezzanine card 100 must be small enough such that Hc, which is the sum of standoff height Hs (Hs is approximately 2 millimeters in a preferred embodiment, thereby allowing enough space to handle standard height SOIC devices), mezzanine card thickness Tm, and device height Hd (in a preferred embodiment, Hd has a maximum value of 1.9 millimeters) is less than the cumulative height limit, which is 4.7 millimeters in the case of the IEEE 1386 specification. In a preferred embodiment, the mezzanine card thickness Tm is approximately 0.8 millimeters.

Figure 6:
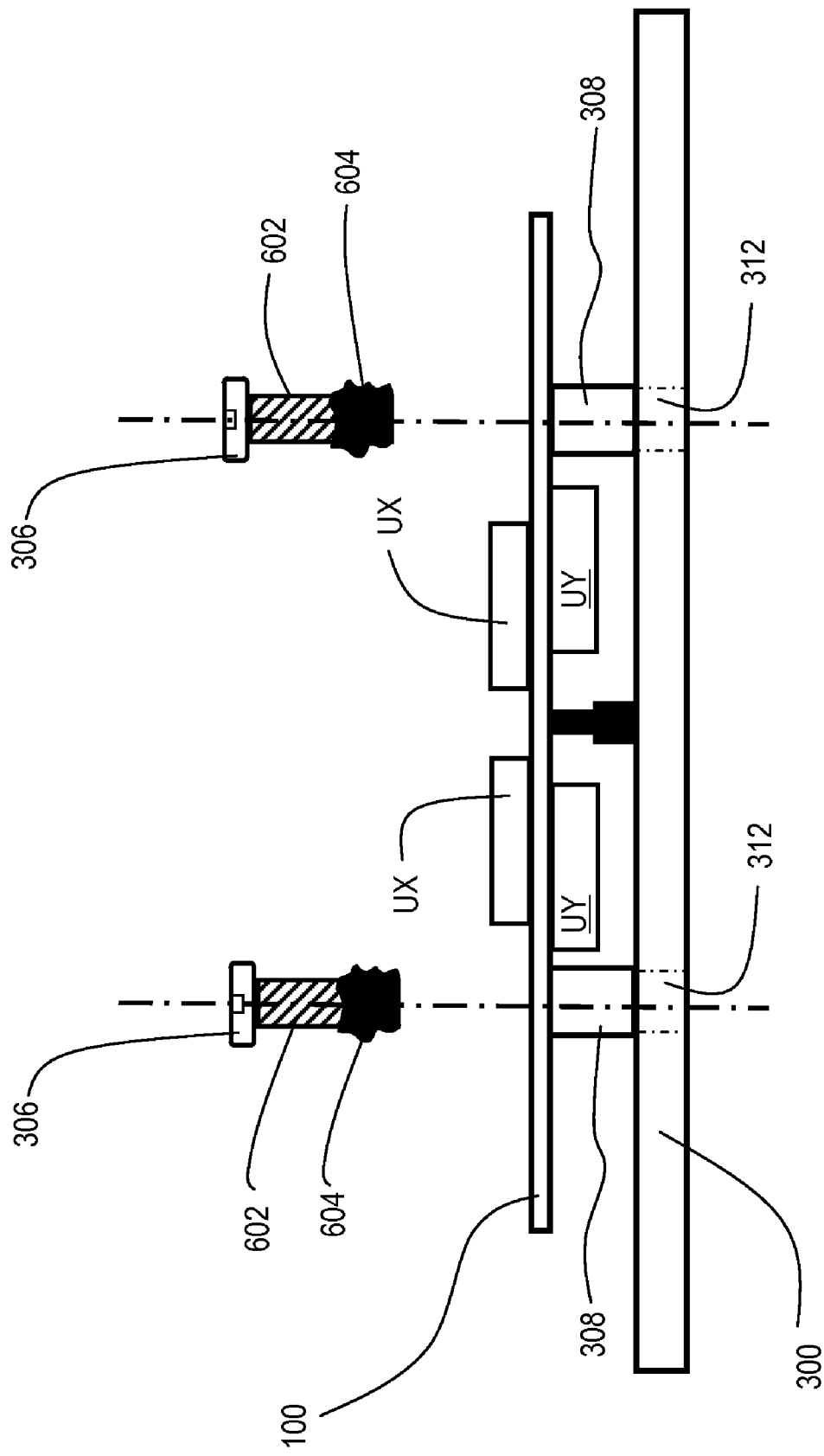
FIG. 6 is an exploded view of a mezzanine card mounted to a carrier card.

FIG. 6 is an exploded view of a mezzanine card 100 mounted to a carrier card 300 as viewed from position A of FIG. 1. In this view, threaded shaft 602 of screw 306 is shown. As part of the assembly process, a layer of adhesive 604 is applied to the lower portion of shaft 602. The screw 306 is then fastened onto carrier card 302 shortly thereafter, before the adhesive sets. After the screws 306 are in place, the adhesive then sets, securing the screws 306, and thus mezzanine card 100, to the carrier card 300. Using this method provides increased robustness in a harsh environment, such as in an industrial application, where the carrier card may be subject to considerable vibration. While it is possible to use lock washers to prevent the screws 306 from loosening after assembly, the adhesive provides an advantage over using a lock washer in that the overall height of the mezzanine card does not increase when an adhesive is used, whereas lock washers do increase the height. In an exemplary embodiment, the adhesive 604 is LOCTITE 222MS, manufactured by Henkel Consumer Adhesives, of Avon, Ohio, USA. LOCTITE 222MS is a non-permanent adhesive. It serves to secure screws 306 and prevent them from loosening due to mechanical vibration and the like. However, since adhesive 604 is non-permanent, the screws 306 may be loosened with a screwdriver, so that the mezzanine card 100 can be removed and replaced as necessary.

Figure 7:
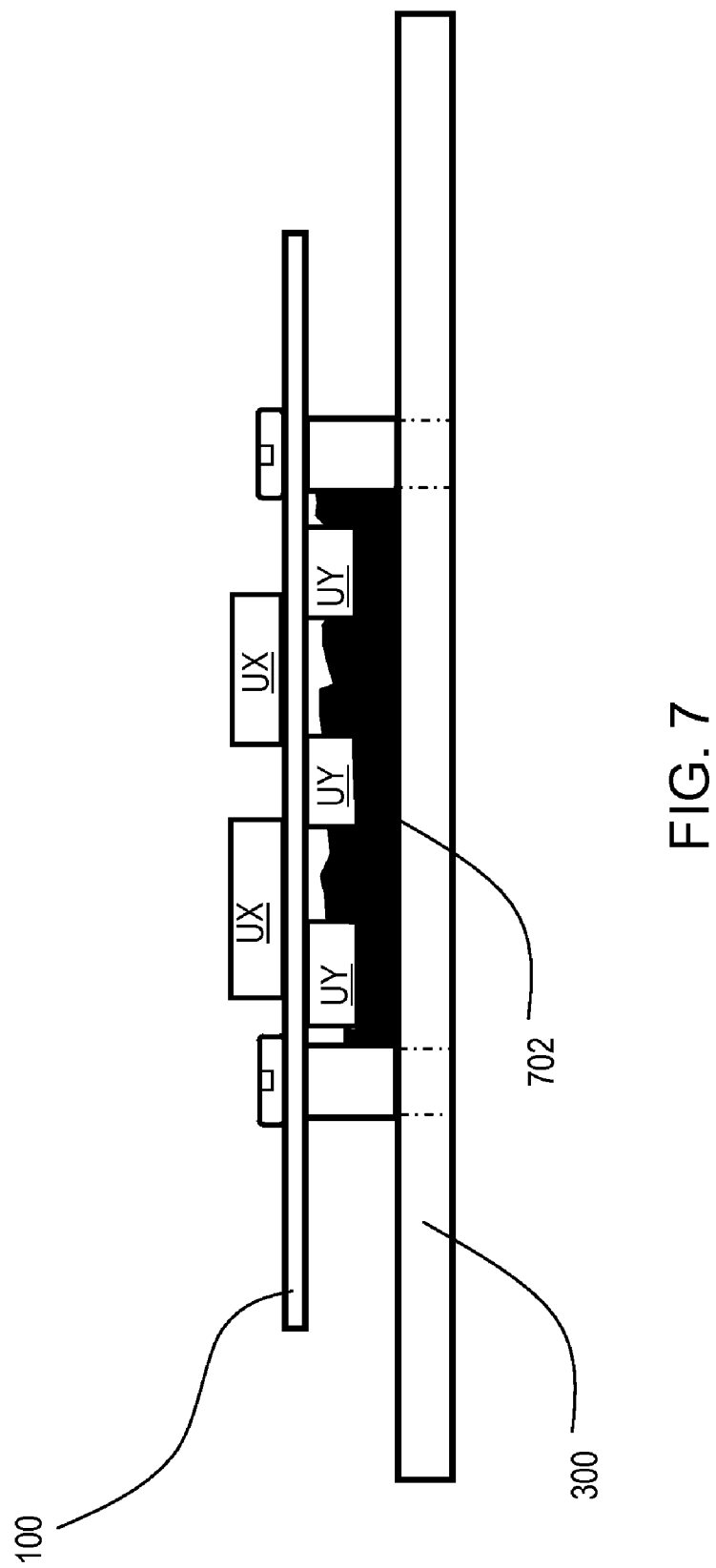
FIG. 7 shows a side view of a mezzanine card mounted to a carrier card with a conformal heat conductive material.

FIG. 7 shows a side view of a mezzanine card 100 mounted to a carrier card 300 as viewed from position B of FIG. 1. In this figure, optional conformal heat conductive material 702 is shown. A layer of conformal heat conductive material 702 is applied on the carrier card 300, underneath mezzanine card 100. The conformal heat conductive material 702 conforms to the chips (referenced as UY) on the connector side of mezzanine card 100. The conformal heat conductive material 702 is most typically used on VITA 20 Conduction Cooled PMC carrier cards. In a low-power application, convection or forced air cooling may be sufficient. However, when the devices give off sufficient heat, conformal heat conductive material 702 can optionally be used to improve heat dissipation. The conformal heat conductive material is an electrically isolating material, preferably having a thermal conductivity of at least 1.0 W/mK (Watt per meter Kelvin), a dielectric breakdown voltage greater than about 6,000 volts AC, and a dielectric constant greater than about 5.4, as measured by ASTM D150. The conformal heat conductive material typically is in sheet form. In one embodiment, the Young's Modulus of the conformal heat conductive material is preferably about 55 kPA, and the density (g/cc) is about 1.6. In an exemplary embodiment, conformal heat conductive material 702 is from the Gap Pad VO Ultra Soft product family, which is manufactured by Bergquist Company of Chanhassen Minn., USA. In an exemplary embodiment, part number GPVOUS-0.100-AC-0816 is used. However, when practicing the present invention, there may be some variation in the part number due to different thickness requirements from one application to the next.

Figure 8:
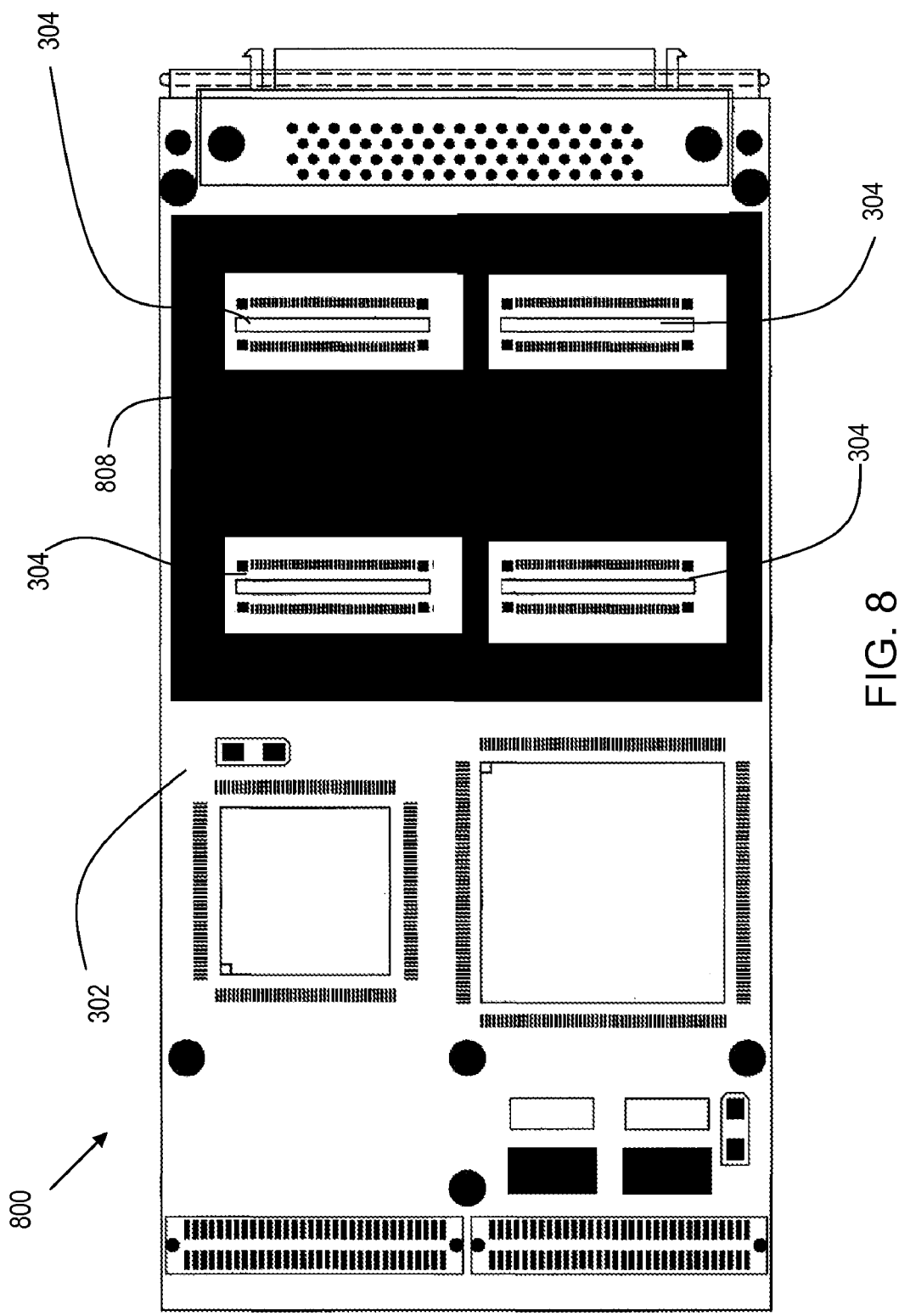
FIG. 8 shows another embodiment of a carrier card of the present invention.

FIG. 8 shows another embodiment of a carrier card of the present invention. In this case, copper ground plane 808 is optionally present on the surface of PMC carrier card 800 in the proximal area of each carrier card connector 304. For the sake of clarity, not all ground planes are indicated with reference numbers in this figure. The presence of the copper ground plane 808 is essential when the optional conformal heat conductive method of the present invention is used. This is shown in FIG. 7. If the conformal heat conductive method of the present invention is used, conformal heat conductive material (702 in FIG. 7) makes contact with the copper ground plane 808. The heat is transferred to copper ground plane 808, and away from the electronic circuitry. Preferably, side rails (not shown) divert the heat from the copper ground plane 808.

Figure 9:
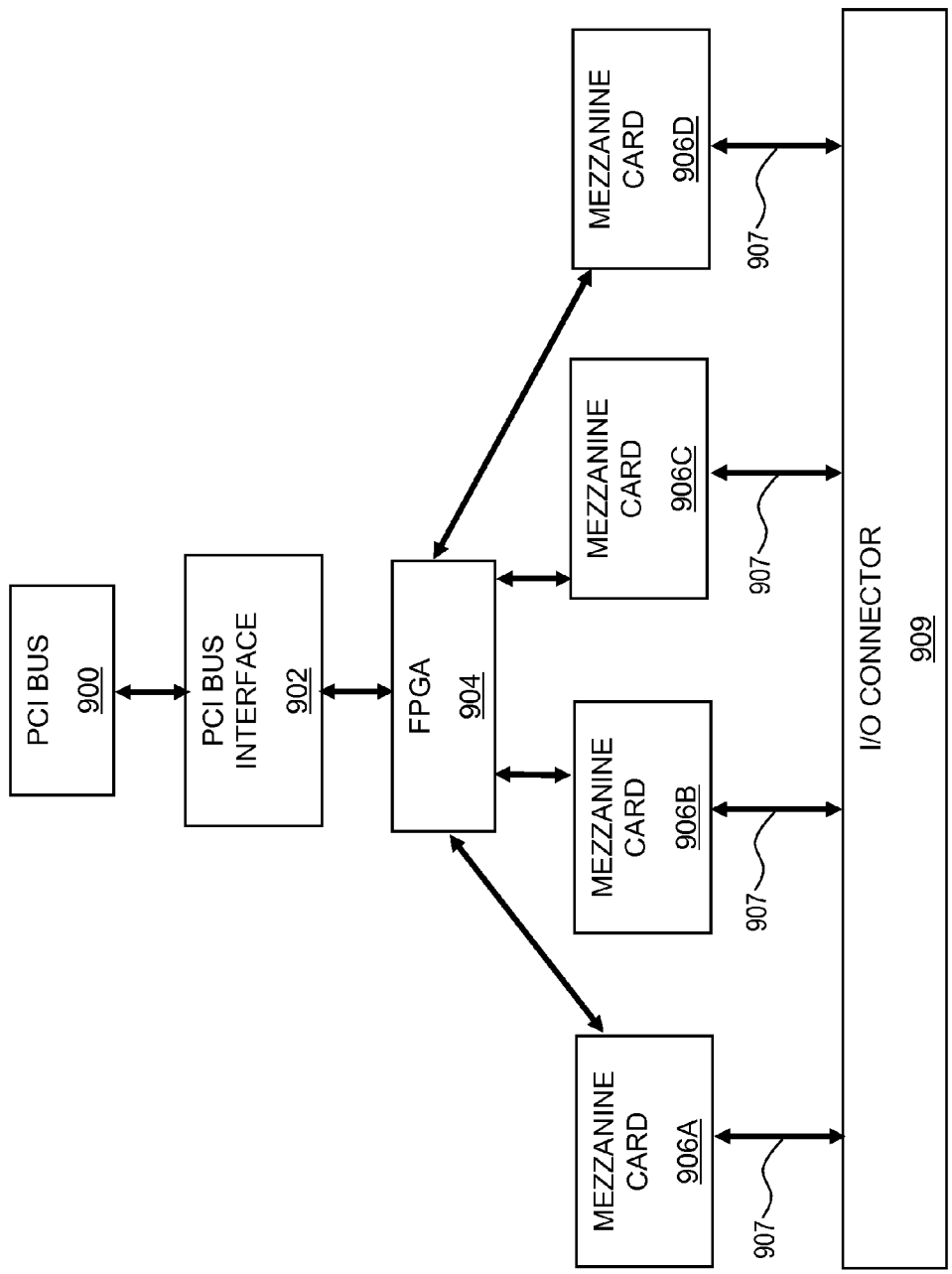
FIG. 9 shows a logical view of a preferred embodiment of the present invention.

FIG. 9 shows a logical view of a preferred embodiment of the present invention. PCI bus 900 is connected to PCI bus interface 902. PCI bus interface 902 provides the necessary circuitry to communicate with FPGA (Field Programmable Gate Array) 904. The PCI bus interface is well known in the art. The FPGA 904 communicates with one or more mezzanine cards, indicated here as 906A-906D. Note that while an FPGA is used to interface with the PCI bus interface in this embodiment, it is possible to use other technologies, such as a microcontroller, to perform this function, without departing from the scope of the present invention. Each mezzanine card 906A-906D is mechanically similar to mezzanine card 100. The mezzanine cards 906A-906D are electrically connected to I/O (input/output) connector 909 through I/O Signals 907. The references 906A-906D refer to specific instances of a mezzanine card. Each mezzanine card can have different electronics to perform a different function. For example, mezzanine card 906A may provide signal conditioning for serial communications (e.g. RS-232) and/or parallel communications (e.g. IEEE-1284), mezzanine card 906B may provide signal conditioning for analog signal acquisition, mezzanine card 906C may provide signal conditioning for digital I/O, and mezzanine card 906D may provide for memory storage, provide for on-board sensors such as temperature sensors, accelerometers, or other transducers, or perform yet another function. While four mezzanine cards are shown in this embodiment, it is possible to have more or less without departing from the scope of the present invention. In general, FPGA 904 provides the logic operations necessary for a particular function, and the signal conditioning is performed on the mezzanine cards 906A-906D. Not all mezzanine cards need be present during use. For example, if the user desired to configure a carrier card with only two functions, then only two mezzanine cards would be used.

In this embodiment, each mezzanine card 906A-906D has a microcontroller (not shown) installed therein to transmit an identification string. In an exemplary embodiment, the microcontroller is a PIC10F200 or similar, manufactured by Microchip Technology Inc., of Chandler, Ariz., USA.

Figure 10:
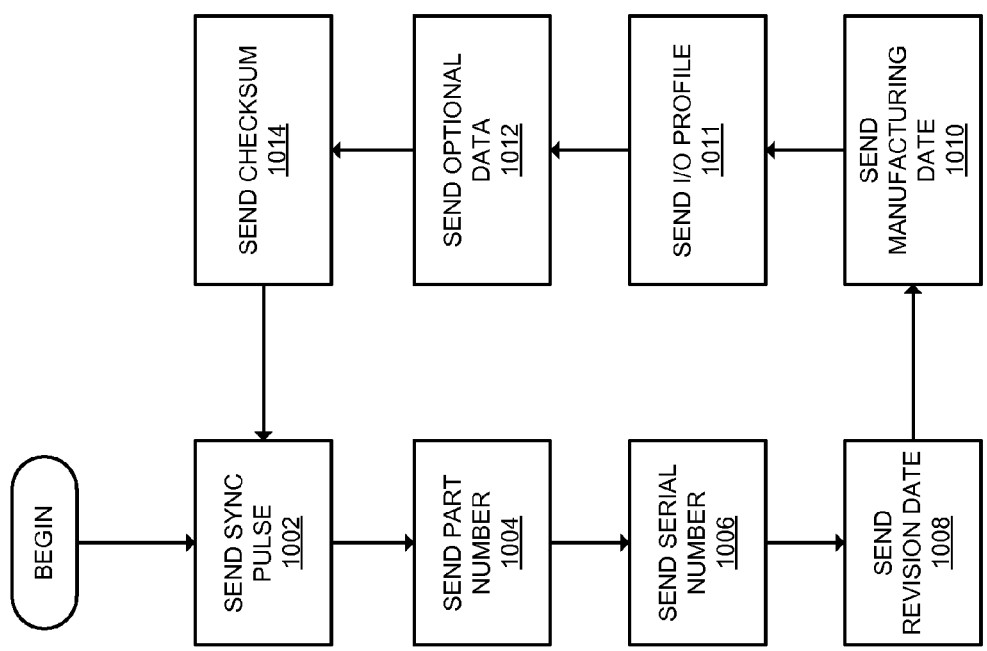
FIG. 10 shows a sequence of steps to generate an identification string.

FIG. 10 shows a sequence of steps performed by the PIC10F200 or equivalent to generate an identification string, hereinafter referred to as an ID string. The ID string is a sequence of data that is periodically retransmitted. The FPGA reads the ID string, and can identify the type of mezzanine card that has been inserted into the carrier card. In a preferred embodiment, the data is pulse width modulated, wherein a zero bit is one pulse width unit, a one bit is two pulse width units, and a sync pulse is three pulse width units.

In step 1002, a sync pulse is sent to the FPGA. This indicates the start of the data sequence. In step 1004, the part number data is sent. In step 1006 a serial number is sent. In step 1008, a revision date is sent. In step 1010 a manufacturing date is sent. In step 1011 an I/O profile is sent. The I/O profile is representative of the configuration of each I/O signal. In step 1012 optional data is sent. In step 1014 a checksum of the previous data is sent. The checksum is optionally used by the FPGA to verify the integrity of the received data. After a periodic delay, the process proceeds to step 1002, and the ID string is retransmitted at a predetermined interval (e.g. every 250 milliseconds).

Figure 11:
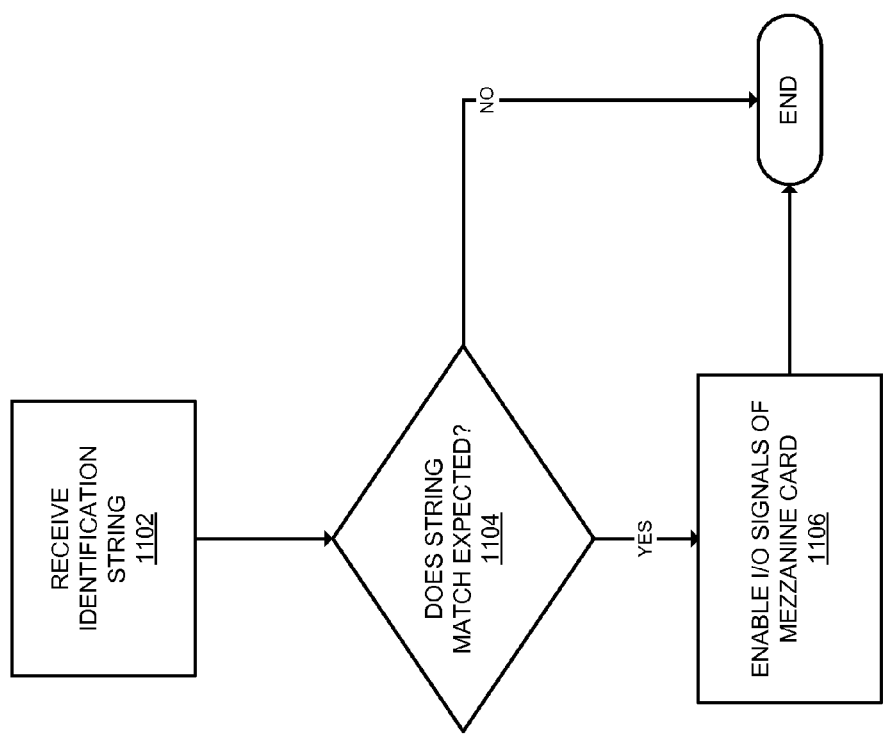
FIG. 11 shows the flowchart of steps performed during module identification.

FIG. 11 shows the flowchart of steps performed by the FPGA during module identification. In general, when a mezzanine card is inserted into the socket on the carrier card, the FPGA 904 provides power to the mezzanine cards 906A-906D, but does not enable the I/O signals 907 of the mezzanine cards 906A-906D. The FPGA 904 reads the ID string and can determine if a particular mezzanine card is designed to work with that carrier card. In step 1102, the ID string is received by the FPGA 904. In step 1104, the FPGA 904 compares the received ID string to an internally stored table of ID strings (not shown). The I/O profile, which contains the configuration data for the I/O signals on the mezzanine cards 906A-906D, is compared to a value stored internally in the FPGA on the carrier card 300. If the I/O profile for a given mezzanine card matches the value internally stored by the FPGA 904, then the I/O signals 907 of the mezzanine card are enabled in step 1106. Various other parameters, such as serial number, revision date, and manufacturing date may optionally be compared. If the compared data does not match, then the I/O signals 907 remain disabled (tri-stated). This provides protection of the electronics if an incorrect mezzanine card is inadvertently placed in the wrong carrier card.

Figure 12:
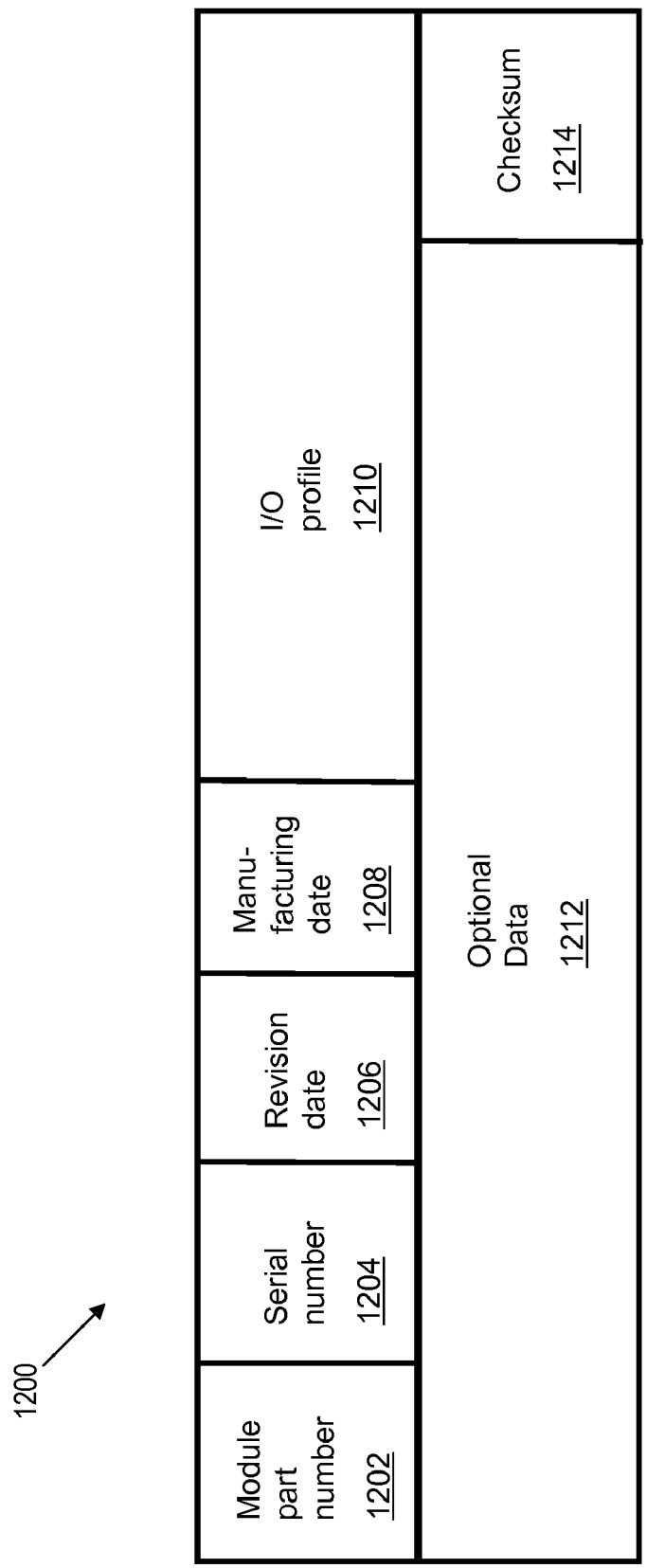
FIG. 12 shows an exemplary ID string 1200 containing various data fields.

FIG. 12 shows an exemplary ID string 1200 containing various data fields. In an exemplary embodiment, the module part number 1202, serial number 1204, revision date 1206, and manufacturing date 1208 are stored as 3 byte BCD encoded data. The I/O profile 1210 is stored as seven bytes of data. Two bits of data are used to represent the configuration setting of each I/O pin. In this embodiment, a two bit value of 00 denotes an output from the mezzanine card, a two bit value of 01 denotes an input to the mezzanine card, and a two bit value of 10 denotes a bi-directional signal. Those skilled in the art will recognize that other values may be used to represent the various I/O states without departing from the scope of the present invention. Optional data 1212 may contain additional information about the module, referred to as "Module Specific Data." The checksum 1214 is optionally used to verify the integrity of the received data.

As can be understood by one of ordinary skill in this art, the present invention provides increased I/O flexibility, acceptable heat dissipation within a small physical form factor, and provides a secure mechanical mounting. Furthermore, a method of modular mezzanine cards is disclosed. The mezzanine cards identify themselves to a processor on the carrier card, and identify their I/O profile to the carrier card which ensures the mezzanine cards are the proper type for the carrier card before enabling the I/O signals of the mezzanine card, thereby minimizing the risk of damage due to human error. Those of ordinary skill in the art will recognize that the above description was simply using exemplary embodiments to illustrate the making and using of the invention and, that other combinations are possible without departing from the scope of the present invention.

What is claimed is:

1. A circuit card assembly comprising:
a carrier card;
at least one single connector mezzanine card;
wherein the single connector mezzanine card makes electrical contact with the carrier card via a mezzanine connector on the mezzanine card that is in electrical contact with a corresponding carrier card connector on the carrier card, and wherein the mezzanine connector is offset from the center of the mezzanine card, the carrier card comprising a plurality of carrier card mounting holes, the mezzanine card having a plurality of mezzanine mounting holes, a plurality of standoffs disposed between the carrier card and the mezzanine card, wherein each mezzanine mounting hole is configured in alignment with a corresponding standoff and a corresponding carrier card mounting hole, and comprising a plurality of fasteners, and a means for securing each of the plurality of fasteners, each of the plurality of fasteners disposed to traverse the corresponding standoff, and engage in the corresponding carrier card mounting hole; and wherein the single connector mezzanine card comprises a microcontroller, said microcontroller being configured and disposed to transmit an identification string;
wherein said identification string comprises an I/O profile, said I/O profile containing a status of each I/O pin on the mezzanine card, including an indication of whether each I/O pin is to be used as an input pin, output pin, or bi-directional pin.

2. The circuit card assembly of claim 1, wherein the single connector mezzanine card has a substantially square form factor in the range of about 1 inch to about 1.25 inches on each side, thereby allowing up to four of the single connector mezzanine cards to be disposed on the carrier card, thereby complying with the dimensional requirements of IEEE 1386 and VITA 20 standards.

3. The circuit card assembly of claim 2, wherein the mezzanine connector is a 2 millimeter stacking connector.

4. The circuit card assembly of claim 1, wherein the carrier card conforms to a standard selected from the group consisting of AMC, PMC, CMC, XMC, CompactPCI, PC/104, PCI, PCI Express, and VME.

5. The circuit card assembly of claim 1, wherein the single connector mezzanine card is configured to perform a function selected from the group consisting of analog signal I/O, serial communications, parallel communications, memory device, sensor, and digital I/O.

6. The circuit card assembly of claim 1, wherein the plurality of fasteners comprises a plurality of screws, each of the plurality of screws having a threaded shaft, and wherein the means for securing each of the plurality of screws comprises a layer of adhesive on the threaded shaft of each of the plurality of screws and wherein no lock washers are present on each of the plurality of screws.

7. A circuit card assembly comprising:
a carrier card;
at least one single connector mezzanine card;
wherein the single connector mezzanine card makes electrical contact with the carrier card via a mezzanine connector on the mezzanine card that is in electrical contact with a corresponding carrier card connector on the carrier card, and wherein the mezzanine connector is offset from the center of the mezzanine card, the carrier card comprising a plurality of carrier card mounting holes, the mezzanine card having a plurality of mezzanine mounting holes, a plurality of standoffs disposed between the carrier card and the mezzanine card, wherein each mezzanine mounting hole is configured in alignment with a corresponding standoff and a corresponding carrier card mounting hole, and comprising a plurality of fasteners, and a means for securing each of the plurality of fasteners, each of the plurality of fasteners disposed to traverse the corresponding standoff and engage in the corresponding carrier card mounting hole, thereby fastening the mezzanine card to the carrier card, wherein the carrier card further comprises a copper ground plane in the proximal area of each carrier card connector, and a layer of conformal heat conductive material disposed on the carrier card and contacting the copper ground plane.

8. A method for configuring a circuit card assembly, said circuit card assembly comprising a carrier card and at least one single connector mezzanine card, the mezzanine card having at least one I/O pin, the method comprising the steps of:
transmitting an identification string from the mezzanine card, wherein the identification string comprises an I/O profile. said I/O profile containing a status of each I/O pin on the mezzanine card. including an indication of whether each I/O pin is to be used as an input pin. output pin, or bi-directional pin;
receiving the identification string on an FPGA on the carrier card;
comparing the identification string with reference data stored on the carrier card;
comparing the I/O profile in the identification string with an I/O profile stored on the carrier card; and
enabling I/O signals on the mezzanine card if the comparison of the identification string and the comparison of the I/O profile match reference data stored on the carrier card, thereby providing protection of the circuit card assembly if an incorrect mezzanine card is inadvertently placed on the carrier card.

9. The method of claim 8, wherein the step of transmitting an identification string further comprises transmitting a module part number.

10. The method of claim 8, wherein the step of transmitting an identification string from the mezzanine card comprises the steps of:
transmitting a sync pulse;
transmitting a part number;
transmitting a serial number;
transmitting a revision date;
transmitting a manufacturing date;
transmitting an I/O profile; and
transmitting a checksum.

11. The method of claim 10, wherein the step of transmitting an I/O profile comprises the step of transmitting a two bit value corresponding to a configuration setting of each I/O pin of the mezzanine card.

12. The method of claim 8, wherein the step of transmitting an identification string from the mezzanine card is repeated periodically at a predetermined interval.

13. A circuit card assembly comprising:
a carrier card;
at least one single connector mezzanine card;
wherein the single connector mezzanine card makes electrical contact with the carrier card via a mezzanine connector on the mezzanine card that is in electrical contact with a corresponding carrier card connector on the carrier card, and wherein the mezzanine connector is offset from the center of the mezzanine card, the carrier card comprising an FPGA configured and disposed to receive an identification string from the mezzanine card and compare said identification string with reference data stored on the carrier card, said FPGA configured and disposed to enable I/O signals on the mezzanine card if data contained within the identification string matches said reference data.

* * * * *